(12) United States Patent
Yukinobu

(10) Patent No.: US 8,040,042 B2
(45) Date of Patent: Oct. 18, 2011

(54) TRANSPARENT ELECTROCONDUCTIVE LAYERED STRUCTURE, ORGANIC ELECTROLUMINESCENT DEVICE USING THE SAME LAYERED STRUCTURE, METHOD FOR PRODUCING THE SAME LAYERED STRUCTURE, AND METHOD FOR PRODUCING THE SAME DEVICE

(75) Inventor: Masaya Yukinobu, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 954 days.

(21) Appl. No.: 10/570,801

(22) PCT Filed: Sep. 8, 2004

(86) PCT No.: PCT/JP2004/013030
§ 371 (c)(1),
(2), (4) Date: Jun. 30, 2008

(87) PCT Pub. No.: WO2005/024853
PCT Pub. Date: Mar. 17, 2005

(65) Prior Publication Data
US 2008/0258605 A1    Oct. 23, 2008

(30) Foreign Application Priority Data

Sep. 8, 2003   (JP) .................................. 2003-315006

(51) Int. Cl.
*H01J 1/62* (2006.01)
*H01J 63/04* (2006.01)

(52) U.S. Cl. ........ 313/504; 313/483; 313/500; 313/501; 313/502; 313/503; 313/505; 313/506; 428/697

(58) Field of Classification Search ........................ None
See application file for complete search history.

(56) References Cited

U.S. PATENT DOCUMENTS

| | | | | |
|---|---|---|---|---|
| 4,539,507 | A | * | 9/1985 | VanSlyke et al. .............. 313/504 |
| 5,247,190 | A | * | 9/1993 | Friend et al. ..................... 257/40 |
| 5,312,643 | A | * | 5/1994 | Yamamoto et al. ........... 427/108 |
| 5,317,169 | A | * | 5/1994 | Nakano et al. ................... 257/40 |
| 5,421,926 | A | * | 6/1995 | Yukinobu et al. ............... 156/83 |
| 6,376,105 | B1 | * | 4/2002 | Jonas et al. .................... 428/690 |
| 6,447,909 | B1 | * | 9/2002 | Kato et al. .................... 428/403 |
| 6,716,480 | B2 | * | 4/2004 | Yukinobu et al. ............. 427/108 |

(Continued)

FOREIGN PATENT DOCUMENTS

JP        59-194393    * 11/1984

(Continued)

*Primary Examiner* — Natalie K Walford
(74) *Attorney, Agent, or Firm* — Kratz, Quintos & Hanson, LLP

(57) ABSTRACT

Disclosed is an organic EL device comprising a transparent electroconductive anode layer which is formed by a simple coating method that enables film formation at a low temperature, which organic EL device is free from electrical short circuit between the transparent electroconductive anode layer and a cathode layer. Also disclosed is a transparent electroconductive layered structure used for manufacturing such an organic EL device. The transparent electroconductive layered structure is characterized by comprising a flat and smooth substrate, a transparent electroconductive anode layer which is formed on the substrate by a coating method and mainly composed of conductive particles, and a transparent substrate joined to the transparent electroconductive anode layer via an adhesive layer. The transparent electroconductive layered structure is also characterized in that the flat and smooth substrate can be separated from the transparent electroconductive anode layer.

31 Claims, 5 Drawing Sheets

U.S. PATENT DOCUMENTS 7,332,381 B2 * 2/2008 Maruyama et al. .......... 438/149

FOREIGN PATENT DOCUMENTS

| JP | 3-192215 | | 8/1991 |
| --- | --- | --- | --- |
| JP | 3-244630 | * | 10/1991 |
| JP | 4-26768 | * | 1/1992 |
| JP | 4-186229 | | 7/1992 |
| JP | 5-325646 | | 12/1993 |
| JP | 6-73374 | | 3/1994 |
| JP | 10-36832 | | 2/1998 |
| JP | 10-92577 | * | 4/1998 |
| JP | 2000-268639 | * | 9/2000 |
| JP | 2000-514590 | * | 10/2000 |
| JP | 2001-93673 | | 4/2001 |
| JP | 2001-229731 | | 8/2001 |
| JP | 2001-250678 | | 9/2001 |
| JP | 2002-163931 | | 6/2002 |
| JP | 2003-17267 | | 1/2003 |
| JP | 2003-204049 | | 7/2003 |

* cited by examiner

TRANSPARENT ELECTROCONDUCTIVE LAYERED STRUCTURE, ORGANIC ELECTROLUMINESCENT DEVICE USING THE SAME LAYERED STRUCTURE, METHOD FOR PRODUCING THE SAME LAYERED STRUCTURE, AND METHOD FOR PRODUCING THE SAME DEVICE

BACKGROUND OF THE INVENTION

1. Field of the Invention

The present invention relates to a transparent electroconductive layered structure, organic electroluminescent device using the same, and method for producing the same layered structure and device, more specifically a transparent electroconductive layered structure as a constituent component for an organic electroluminescent device (hereinafter referred to as organic EL device), which is used as a light source (e.g., liquid-crystal device's back light) or display, organic EL device using the same layered structure, and methods for producing the same layered structure and organic EL device.

2. Description of the Prior Art

An electroluminescent device is self-luminous, unlike a liquid-crystal device, and an inorganic electroluminescent device (hereinafter referred to as inorganic EL device) with an inorganic fluorescent material serving as the light-emitting material has been used as a component for displays. An inorganic EL device, however, involves several disadvantages, which have limited its applicable areas. For example, it can emit limited types of colors, and needs a high operating voltage.

Recently, an organic EL device of two-layered structure with an organic light-emitting layer and charge-transporting compound layer has been proposed (as disclosed by, e.g., JP-A-59-194393). It can work at a low voltage to realize high luminance, and easily produce varying emitted light wavelengths. Therefore, it has been extensively studied for commercialization, because of these advantages.

An organic light-emitting layer for an organic EL device has been mainly produced by vacuum evaporation of a low-molecular-weight light-emitting material (refer to JP-A-59-194393) or coating a substrate with a high-molecular-weight light-emitting material or precursor therefor (refer to, e.g., JP-A-03-244630 or JP-A-10-092577), the latter being more noted because of the simpler organic EL device production process and potential for reducing the production cost.

Some of the high-molecular-weight light-emitting materials proposed so far for forming an organic, light-emitting layer include poly(p-phenylene vinylene) as a conjugated high-molecular-weight compound produced by polymerization of the solvent-soluble precursor, in which it is spread, dried and heat-treated at high temperature (refer to JP-A-10-092577), and another conjugated, high-molecular-weight compound soluble in a solvent and needs no heat-treatment at high temperature (refer to JP-A-03-244630).

Moreover, JP-A-2000-514590, for example, proposes a hole-injection layer of electroconductive high-molecular-weight compound, e.g., polythiophene derivative, formed between an anode and light-emitting layer, to improve light-emitting efficiency and durability of the organic EL device in which it is used.

Of the layers which constitute the above organic EL device, the organic light-emitting layer and hole-injection layer are produced by a coating method in which a high-molecular-weight light-emitting compound or electroconductive high-molecular-weight compound is spread and dried. On the other hand, a transparent electroconductive film as the anode is made of an electroconductive oxide, e.g., indium tin oxide (ITO) or antimony tin oxide (ATO), and formed by a physical method, e.g., sputtering.

However, the physical method for producing the transparent electroconductive film is not preferable costwise, because it needs a large-size production system and a film-making apparatus operating under a vacuum. Another disadvantage involved in the physical method is need for heat-treatment of the substrate while the film is being formed thereon. This excludes a plastic for the substrate, because of its low heat resistance.

Therefore, several proposals have been made to form a transparent electroconductive film more simply at lower temperature using a coating liquid dispersed with fine electroconductive particles in a solvent to be spread on a substrate, dried and, as required, heat-treated.

For example, JP-A-4-26768 proposes a coating liquid dispersed with fine ITO particles as the electroconductive particles to form a transparent electroconductive film. JP-A-2000-268639 proposes fine electroconductive particles of a noble metal, e.g., gold or silver, dispersed in a coating liquid to form a transparent electroconductive film of still improved film characteristics, e.g., resistance and transmittance.

These methods, in which a coating liquid is used to form a transparent electroconductive film, involve problems when applied to preparation of an anode for the above-described organic EL device. The transparent electroconductive anode prepared using the coating liquid for forming a transparent electroconductive film invariably has a rougher surface than that prepared by the physical method, because of the presence of fine particles dispersed in the coating liquid. Moreover, the coating liquid contains small quantities of coarse electroconductive particles, which may be secondary particles of agglomerated fine particles. These particles may cause uneven spreading while the coating liquid is spread or dried, and eventually notable irregularities on the film surface.

The irregularities or projections of the transparent electroconductive anode layer, when excessively grow, may cause problems, e.g., electrical short circuit between the transparent electroconductive anode layer and cathode layer, failure of light emission by the organic EL device, notably deteriorated light-emitting efficiency, or the like.

It is therefore difficult to use a transparent electroconductive film prepared by a coating method as the transparent electroconductive film for an organic EL device.

SUMMARY OF THE INVENTION

The present invention has been developed in consideration of the above situations. It is an object of the present invention to provide a transparent electroconductive layered structure used for production of an organic EL device suffering no short circuit between a transparent electroconductive anode layer and cathode layer, although a transparent electroconductive layer as the transparent electroconductive anode layer is prepared by a coating method, which can be carried out by a simple, low-cost procedure operating at a low temperature. The other objects of the present invention are to provide an organic EL device, and methods for producing the transparent electroconductive layered structure and organic EL device.

The inventors of the present invention have found, after having extensively studied to solve the above problems, that a transparent electroconductive anode layer formed by a coating method on a flat and smooth substrate with the other side joined to a transparent substrate via an adhesive layer allows the flat and smooth substrate to be released to leave behind a sufficiently flat and smooth surface, on which a light-emitting layer of polymer or cathode electrode layer with no surface irregularities or projections can be easily formed, because the anode layer itself is supported by the transparent substrate via an adhesive layer, and can be used for an organic EL device useful as a light source (e.g., liquid-crystal back light) or display, because it causes no short circuit between itself and the cathode layer, reaching the present invention.

The first aspect of the present invention is a transparent electroconductive layered structure (hereinafter sometimes referred to as the first embodiment) comprising a flat and smooth substrate, transparent electroconductive anode layer containing fine electroconductive particles as the main component, formed on the flat and smooth substrate by a coating method, and transparent substrate joined to the transparent electroconductive anode layer via an adhesive layer, wherein the flat and smooth substrate can be released from the transparent electroconductive anode layer.

The second aspect of the present invention is a transparent electroconductive layered structure (hereinafter sometimes referred to as the second embodiment) comprising a flat and smooth substrate, hole-injection layer formed on the flat and smooth substrate by a coating method, transparent electroconductive anode layer formed on the hole-injection layer by a coating method, and transparent substrate joined to the transparent electroconductive anode layer via an adhesive layer, wherein the flat and smooth substrate can be released from the hole-injection layer.

The third aspect of the present invention is the transparent electroconductive layered structure according to the first or second aspect, wherein the transparent electroconductive anode layer is further coated partly with a metallic auxiliary electrode.

The fourth aspect of the present invention is the transparent electroconductive layered structure according to the first or second aspect, wherein a transparent coat layer is further formed by a coating method between the transparent electroconductive anode layer and adhesive layer.

The fifth aspect of the present invention is the transparent, electroconductive layered structure according to the first or second aspect, wherein the adhesive layer contains, in addition to an organic resin, a dehydrating agent and/or deoxidant.

The sixth aspect of the present invention is the transparent electroconductive layered structure according to the first or second aspect, wherein the fine electroconductive particles have an average particle diameter of 1 to 100 nm, contain a noble metal and form a net-work structure in the transparent electroconductive anode layer.

The seventh aspect of the present invention is the transparent electroconductive layered structure according to the sixth aspect, wherein the fine noble-metal-containing particles are metallic particles containing gold and/or silver.

The eighth aspect of the present invention is the transparent electroconductive layered structure according to the first or second aspect, wherein the fine electroconductive particles are oxide particles.

The ninth aspect of the present invention is the transparent electroconductive layered structure according to the eighth aspect, wherein the fine electroconductive oxide particles comprise at least one species of material selected from the group consisting of indium oxide, tin oxide and zinc oxide.

The tenth aspect of the present invention is the transparent electroconductive layered structure according to the first or second aspect, wherein the adhesive layer has a sufficient thickness to cover projections of the fine electroconductive particles which constitute the surface of the transparent electroconductive anode layer.

The 11$^{th}$ aspect of the present invention is a method for producing the transparent electroconductive layered structure according to the first aspect, wherein a coating liquid containing fine electroconductive particles dispersed in a solvent for forming the transparent electroconductive anode layer is spread and dried on the sufficiently flat and smooth substrate, which can be released from the coating layer formed thereon, to form the transparent electroconductive anode layer, and the transparent substrate is joined to the transparent electroconductive anode layer with an adhesive agent.

The 12$^{th}$ aspect of the present invention is a method for producing the transparent electroconductive layered structure according to the second aspect, wherein a coating liquid containing a hole-injecting material in a solvent for forming the hole-injection layer is spread and dried on the sufficiently flat and smooth substrate, which can be released from the coating layer formed thereon, to form the hole-injection layer on the flat and smooth substrate, then a coating liquid containing fine electroconductive particles in a solvent for forming the transparent electroconductive anode layer is spread and dried on the hole-injection layer to form the transparent electroconductive anode layer, and the transparent substrate is joined to the transparent electroconductive anode layer with an adhesive agent.

The 13$^{th}$ aspect of the present invention is the method according to the 11$^{th}$ or 12$^{th}$ aspect for producing the transparent electroconductive layered structure, wherein the transparent electroconductive anode layer formed is coated partly with a metallic auxiliary electrode, formed by printing the transparent electroconductive anode layer with a paste containing fine metallic particles in a solvent for forming the metallic auxiliary electrode and curing the paste.

The 14$^{th}$ aspect of the present invention is the method according to the 11$^{th}$ or 12$^{th}$ aspect for producing the transparent electroconductive layered structure, wherein a coating liquid containing a binder in a solvent for forming a transparent coat layer is spread and dried on the transparent electroconductive anode layer to coat the anode layer with the transparent coat layer, and the transparent substrate is joined to the transparent coat layer with an adhesive agent.

The 15$^{th}$ aspect of the present invention is the method according to the 11$^{th}$ or 12$^{th}$ aspect for producing the transparent electroconductive layered structure, wherein the adhesive agent contains, in addition to an organic resin, a dehydrating agent and/or deoxidant.

The 16$^{th}$ aspect of the present invention is the method according to the 11$^{th}$ or 12$^{th}$ aspect for producing the transparent electroconductive layered structure, wherein the fine electroconductive particles have an average particle diameter of 1 to 100 nm, and contain a noble metal.

The 17$^{th}$ aspect of the present invention is the method according to the 16$^{th}$ aspect for producing the transparent electroconductive layered structure, wherein the fine noble-metal-containing particles are metallic particles containing gold and/or silver.

The 18$^{th}$ aspect of the present invention is the method according to the 11$^{th}$ or 12$^{th}$ aspect for producing the transparent electroconductive layered structure, wherein the fine electroconductive particles are fine electroconductive oxide particles.

The 19$^{th}$ aspect of the present invention is the method according to the 18$^{th}$ aspect for producing the transparent electroconductive layered structure, wherein the fine electroconductive oxide particles comprise at least one species of material selected from the group consisting of indium oxide, tin oxide and zinc oxide.

The 20th aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the first or second aspect of the present invention, and the cathode layer is formed on the light-emitting layer of polymer.

The 21st aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the third aspect of the present invention, and the cathode layer is formed on the light-emitting layer of polymer.

The 22nd aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the fourth aspect of the present invention, and the cathode layer is formed on the light-emitting layer of polymer.

The 23rd aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the fifth aspect of the present invention, and the cathode layer is formed on the light-emitting layer of polymer.

The 24th aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the sixth aspect of the present invention, and the cathode layer is formed on the light-emitting layer of polymer.

The 25th aspect of the present invention is an organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to the eighth aspect of the present invention, and the cathode layer is formed on the light-emitting layer of polymer.

The 26th aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 11th or 12th aspect of the present invention to form the light-emitting layer of polymer on the surface, and a cathode layer is formed on the light-emitting layer of polymer.

The 27th aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 13th aspect of the present invention to form the light-emitting layer of polymer on the surface, and a cathode layer is formed on the light-emitting layer of polymer.

The 28th aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 14th aspect of the present invention to form the light-emitting layer of polymer on the surface, and a cathode layer is formed on the light-emitting layer of polymer.

The 29th aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 15th aspect of the present invention to form the light-emitting layer of polymer on the surface, and a cathode layer is formed on the light-emitting layer of polymer.

The 30th aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 16th aspect of the present invention to form the light-emitting layer of polymer on the surface, and a cathode layer is formed on the light-emitting layer of polymer.

The 31st aspect of the present invention is a method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to the 18th aspect of the present invention to form the light-emitting layer of polymer on the surface, and a cathode layer is formed on the light-emitting layer of polymer.

The transparent electroconductive layered structure of the present invention allows a light-emitting layer of polymer or cathode layer with no surface irregularities or projections to be easily formed on the flat and smooth surface of its transparent electroconductive anode layer, left by the flat and smooth substrate released from the layered structure, and can be used as a constituent component for an organic EL device.

The present invention can provide an organic EL device whose transparent electroconductive anode layer can be formed by a coating method, which can be carried out by a simple, low-cost procedure operating at a low temperature. Therefore, it has a light-emitting layer of polymer unlikely to easily deteriorate and useful as a light source (e.g., liquid-crystal device's back light) or display.

NOTATION

Figure 1:
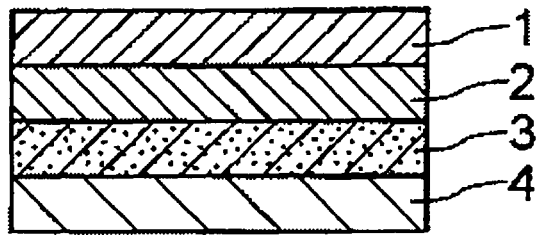
FIG. 1 is a sectional view of the transparent electroconductive layered structure of the present invention, illustrating its basic structure.

1 Flat and smooth substrate
2 transparent electroconductive anode layer
3 Adhesive layer
4 Transparent substrate
5 Hole-injection layer
6 Light-emitting layer of polymer
7 Cathode layer
8 Transparent coat layer
9 Projection
10 Auxiliary electrode
11 Dehydrating agent and/or deoxidant

DETAILED DESCRIPTION OF THE INVENTION

The transparent electroconductive layered structure, organic EL device and methods for producing them are described individually by referring to the attached drawings.

1. Transparent Electroconductive Layered Structure

The first embodiment of the transparent electroconductive layered structure of the present invention comprises a flat and smooth substrate, transparent electroconductive anode layer containing fine electroconductive particles as the main component, formed on the flat and smooth substrate by a coating method, and transparent substrate joined to the transparent electroconductive anode layer via an adhesive layer, wherein the flat and smooth substrate can be released from the transparent electroconductive anode layer.

Similarly, the second embodiment of the transparent electroconductive layered structure of the present invention comprises a flat and smooth substrate, hole-injection layer formed on the flat and smooth substrate by a coating method, transparent electroconductive anode layer containing fine electroconductive particles as the main component, formed on the hole-injection layer by a coating method, and transparent substrate joined to the transparent electroconductive anode layer via an adhesive layer, wherein the flat and smooth substrate can be released from the hole-injection layer.

Figure 3:
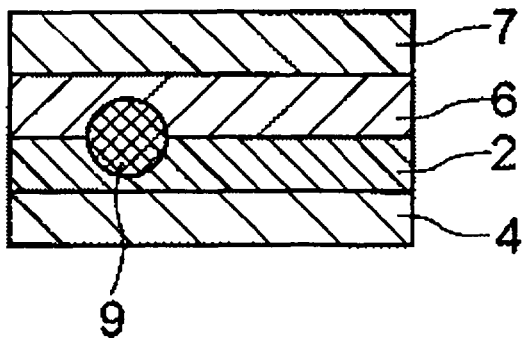
FIG. 3 is a sectional view of a conventional organic EL device illustrating its basic structure, where a projection is schematically shown.

A conventional organic EL device, shown in FIG. 3, comprises the transparent substrate 4, transparent electroconductive anode layer 2, produced with a coating liquid for forming a transparent electroconductive layer spread and dried on the substrate 4 to form the layer 2 thereon, light-emitting layer 6 of polymer and cathode electrode 7, where a flat and smooth substrate is not used. It tends to have a short circuit between the layer 2 and cathode layer 7, when the large projection 9 evolves in the layer 2 by defective coating or the like, which tends to cause problems, e.g., failure of light emission by the organic EL device, notably deteriorated light-emitting efficiency, or dielectric breakdown of the layer 6.

The present invention adopts a transparent electroconductive layered structure, produced by a transferring method described in detail later, to solve the above problems. The first embodiment, shown in FIG. 1, comprises the flat and smooth substrate 1 which supports the transparent electroconductive anode layer 2, formed on the substrate 1 by a coating method in which a coating liquid for forming the transparent electroconductive layer is spread and dried on the substrate 1, and transparent substrate 4 joined to the transparent electroconductive anode layer with an adhesive agent, in this order, where the substrate 1 is later released from the assembly, whereas the substrate 4 works as a constituent component for the organic EL device in which the layered structure is used. The coating liquid for forming the transparent electroconductive anode layer 2 is described in detail later.

The transparent electroconductive layered structure thus produced has a basic structure illustrated in FIG. 1. It comprises the flat and smooth substrate 1, transparent electroconductive anode layer 2 formed on the substrate 1 by a coating method, and transparent substrate 4 joined to the layer 2 via an adhesive layer 3, wherein the substrate 1 is used tentatively to support the layer 2 and can be released from the layer 2.

The material for the flat and smooth substrate for the present invention is not limited, so long as it can be released from the interface with the transparent electroconductive anode layer or hole-injection layer. More specifically, the materials useful for the substrate include glass, plastics, e.g., polyethylene terephthalate (PET), polyethylene naphthalate (PEN) and polyether sulfone (PES), and metals, e.g., stainless steel. Of these, a PET film is more preferable for various reasons, e.g., inexpensiveness, high surface flatness, flexibility and ease of being released.

The material for the transparent substrate, on the other hand, may be the one traditionally used for organic EL devices. For example, the materials useful for the substrate, which are transparent to visible light, include plastics, e.g., polyethylene terephthalate (PET), polyethylene naphthalate (PEN) and polyether sulfone (PES) in the form of film or plate, and glass in the form of plate. A plastic, when used for a transparent substrate, is preferably coated with a moisture-proof material, to prevent moisture-induced deterioration of the organic EL device. Moreover, the transparent substrate is preferably treated to have improved adhesion to an adhesive agent. More specifically, it is preferably treated beforehand with a primer, plasma, corona discharge, ultraviolet ray of short wavelength, silane coupling agent, or the like.

The transparent substrate may be of a glass plate or plastic film coated beforehand with a color filter. In this case, a material capable of emitting white light may be used for a light-emitting layer of polymer to realize an organic EL device.

The adhesive agent for the present invention may be selected from various ones, including resins curable at normal temperature (e.g., acryl-, urethane- and epoxy-based ones), thermosetting resins, and resins curable with ultraviolet ray or electron beams. It is not limited to the above, so long as it can at least keep the transparent electroconductive anode layer or transparent coat layer adhering to the transparent substrate while the flat and smooth substrate is being released, and exerts no harmful effect on releasability of the flat and smooth substrate.

Thickness of the adhesive layer is not limited, so long as it sufficiently covers the projections on the transparent electroconductive anode layer surface. The adequate adhesive layer thickness depends on thickness of the transparent electroconductive anode layer. The coating method is generally not limited so long as it can secure a thickness of around 0.5 µm or more. It may not always cover the projections on the transparent electroconductive anode layer, when it is thinner than 0.5 µm. On the other hand, increasing the thickness beyond 500 µm is not economical, because little functional advantage of the adhesive layer is expected. Moreover, it may shrink excessively, depending on adhesive agent type used, to deform the transparent electroconductive layered structure.

The major characteristic of the transparent electroconductive layered structure of the present invention is flatness of the surface from which the flat and smooth substrate is released. More specifically, the flat surface means that it has an average centerline roughness (Ra) of 10 nm or less, preferably 8 nm or less, more preferably 5 nm or less. The present invention can realize the very flat surface having an Ra value of 3 nm or less by optimizing type of coating liquid, coating conditions, type of adhesive agent and thickness of the adhesive layer.

Average centerline roughness Ra is determined by an atomic force microscope. More specifically, a total of 10 points (1 by 1 µm in area) on the film surface are arbitrarily chosen and observed by the microscope, to find the average. The surface left by the flat and smooth substrate may deteriorate characteristics of the light-emitting layer of polymer or the like formed thereon, when it has a Ra value above 10 nm, in particular in the case of an organic EL device. In such a case, a surface-flattening step, e.g., etching or grinding, may be additionally required.

The adhesive agent preferably contains, in addition to an organic resin, a dehydrating agent and/or deoxidant. Incorporation of the agent(s) can suppress deterioration of the light-emitting layer 6 of polymer and cathode electrode layer 7. The dehydrating agents include silica gel, zeolite, phosphorus pentaoxide, sodium sulfate, calcium oxide and barium oxide. The deoxidants include various metals, e.g., iron, magnesium and calcium, which easily form a chemical bond with oxygen, and organic ones. They may be in the form of fine particles or dissolved in a molecular state, so long as they keep their functions. The useful agents are not limited to the above.

Figure 12:
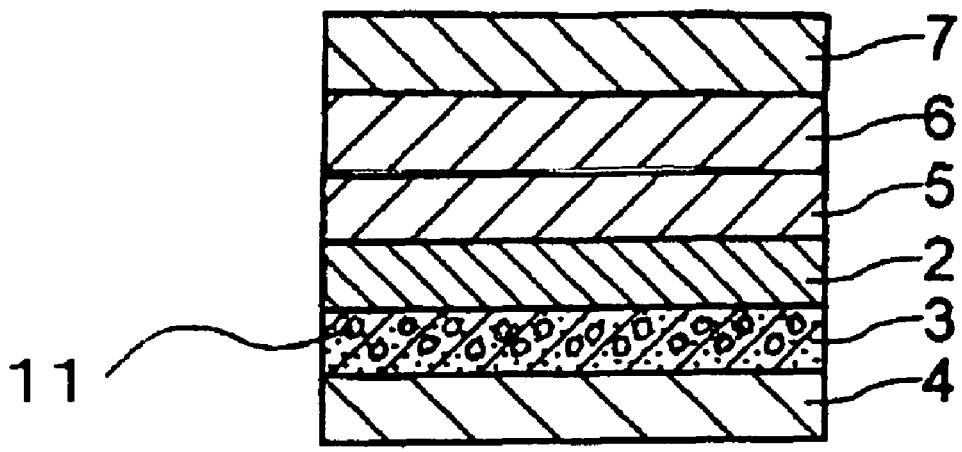
FIG. 12 is a sectional view of the organic EL device of the present invention illustrating its adhesive layer provided with a dehydrating agent and/or deoxidant.
Figure 13:
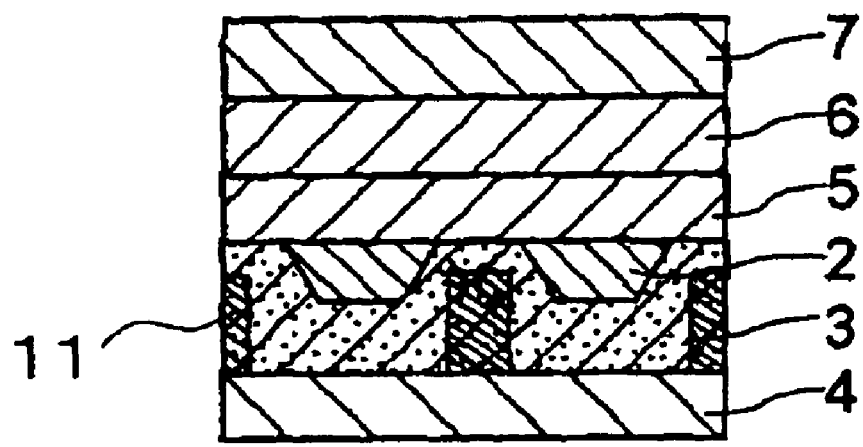
FIG. 13 is a sectional view of the organic EL device of the present invention illustrating its adhesive layer provided with a dehydrating agent and/or deoxidant.

The dehydrating agent or deoxidant may be mixed uniformly with the adhesive agent, when it is light-transmittable, as illustrated in FIG. 12. When it is not light-transmittable, it may be located in places in the adhesive layer in such a way not to face the light-emitting area of the light-emitting layer of polymer, as illustrated in FIG. 13. For example, it may be located in the space between the light-emitting areas, when the light-emitting layer of polymer is formed by patterning.

Figure 2:
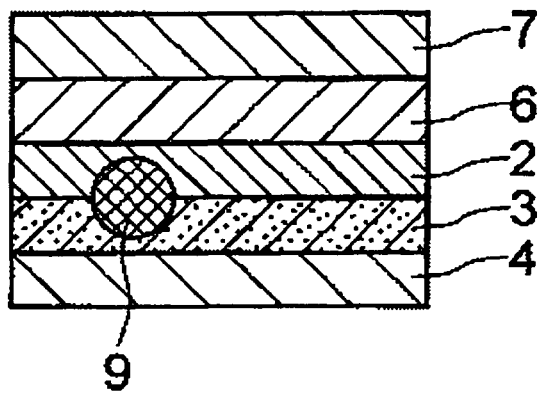
FIG. 2 is a sectional view of the organic EL device of the present invention illustrating its basic structure, where a projection is schematically shown.

The flat and smooth substrate 1, when released from the transparent electroconductive layered structure shown in FIG. 1, leaves behind the exposed surface of the transparent electroconductive anode layer 2. It has a high flatness, reflecting the flat and smooth substrate 1 surface. Therefore, the organic EL device of the present invention, described in detail later, can be realized by spreading and drying a coating liquid for forming the light-emitting layer of polymer on the flat exposed surface of the transparent electroconductive anode layer 2 to form the light-emitting layer 6 of polymer thereon and then forming the cathode layer 7 on the layer 6, as illustrated in FIG. 2.

Figure 4:
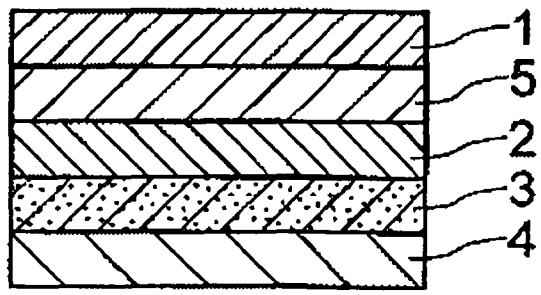
FIG. 4 is a sectional view of the transparent electroconductive layered structure of the present invention, illustrating another structure.
Figure 5:
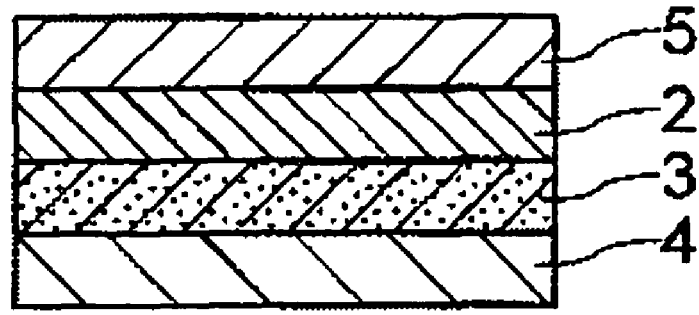
FIG. 5 is a sectional view of the transparent electroconductive layered structure shown in FIG. 4, left by the flat and smooth substrate.
Figure 6:
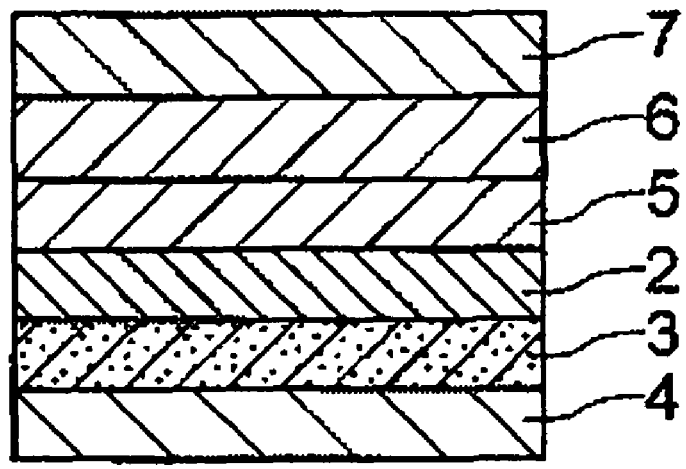
FIG. 6 is a sectional view of the organic EL device in which the transparent electroconductive layered structure shown in FIG. 4 is used.

On the other hand, the second embodiment, shown in FIG. 4, comprises the flat and smooth substrate 1 which supports the hole-injection layer 5 formed on the substrate 1 by a coating method in which a coating liquid for forming the hole-injection layer is spread and dried on the substrate 1, transparent electroconductive anode layer 2 formed on the hole-injection layer 5 by a coating method in which a coating liquid for forming the transparent electroconductive layer is spread and dried on the hole-injection layer 5, and transparent substrate 4 joined to the transparent electroconductive anode layer with an adhesive agent which is later cured, in this order.

Forming the hole-injection layer of electroconductive polymer before forming the transparent electroconductive anode layer 2 can improve light-emitting efficiency and durability of the organic EL device.

A coating liquid for forming the hole-injection layer comprises a solvent and hole-injecting material. The hole-injecting materials include, but not limited to, polysilane, polyaniline, polythiophene and derivatives thereof, e.g., a mixture of poly(3,4-ethylenedioxythiophene) and polystyrene sulfonic acid (PEDOT/PSS) (Bayer, Baytron®).

The transparent electroconductive layered structure of the second embodiment of the present invention thus produced has a basic structure illustrated in FIG. 4. It comprises the flat and smooth substrate 1, hole-injection layer 5 formed on the smooth substrate 1 by a coating method, similarly formed transparent electroconductive anode layer 2, and transparent substrate 4 joined to the layer 2 via the adhesive layer 3, wherein the substrate 1 is used tentatively to support the layer 2 and can be released from the layer 2.

The transparent electroconductive layered structure of the present invention may be further provided with a transparent coat layer formed by a coating method between the transparent electroconductive anode layer and adhesive layer.

A coating liquid for forming the transparent coat layer comprises a solvent and binder. The binder may be similar to that for forming the transparent electroconductive anode layer. It may be an organic or inorganic binder, or a combination thereof. A binder comprising a silica sol as the main component is particularly preferable. The transparent coat layer, when formed, helps fast bind the fine electroconductive particles in the transparent electroconductive anode layer to each other, to bring an effect of reducing film resistance.

The transparent electroconductive layered structure of the present invention may be stored directly in the as-prepared condition. The flat and smooth substrate may be released immediately before the light-emitting layer of polymer is formed for production of the organic EL device. Therefore, it has an advantage of effectively preventing deposition of foreign matter, dust or the like on the exposed surface.

2. Method for Producing the Transparent Electroconductive Layered Structure

The method of the present invention for producing the transparent electroconductive layered structure comprises steps for spreading, on the flat and smooth substrate, a coating liquid containing a solvent and fine electroconductive particles as the main components for forming the transparent electroconductive anode layer; for drying the coating liquid to form the transparent electroconductive anode layer; and for joining the transparent substrate to the transparent electroconductive anode layer with an adhesive agent.

Production of the transparent electroconductive layered structure of the present invention begins with spreading a coating liquid containing a solvent and fine electroconductive particles as the main components for forming the transparent electroconductive anode layer on a substrate of flat and smooth surface. The coating liquid for forming the transparent electroconductive anode layer and method of coating the substrate with the coating liquid are described in detail later.

A hole-injection layer of electroconductive polymer may be formed before the transparent electroconductive anode layer is formed to improve light-emitting efficiency and durability of the organic EL device, as discussed earlier.

Figure 7:
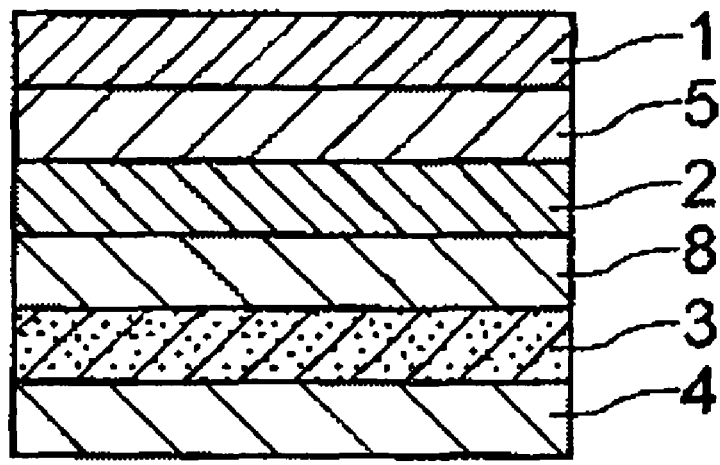
FIG. 7 is a sectional view of the transparent electroconductive layered structure of the present invention, illustrating still another structure.
Figure 8:
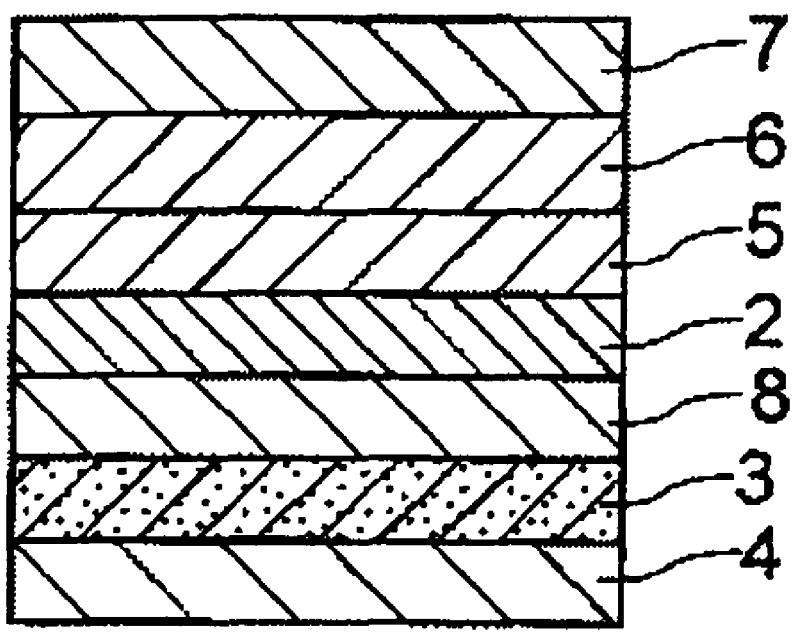
FIG. 8 is a sectional view of the organic EL device in which the transparent electroconductive layered structure shown in FIG. 7 is used.

One embodiment of the method of the present invention produces the transparent electroconductive layered structure, shown in FIG. 7. It coats the flat and smooth substrate 1 with the optional hole-injection layer 5, transparent electroconductive anode layer 2, transparent coat layer 8 formed by a coating method in which a coating liquid for forming the transparent coat layer 8 is spread and dried, and transparent substrate 4 joined to the layer 8 with an adhesive agent, in this order.

Coating the transparent electroconductive anode layer 2 with a coating liquid for forming the transparent coat layer can accelerate contact of the fine electroconductive particles in the transparent electroconductive anode layer 2 with each other, because the binder component in the coating liquid penetrates into the gaps between the particles of layer 2. This improves electroconductivity of the transparent electroconductive anode layer 2 and, at the same time, improves strength of the layer 2 itself.

Each of the transparent electroconductive anode layer 2, hole-injection layer 5 and transparent coat layer 8 may be formed by a coating method. More specifically, each layer can be formed with a coating liquid for forming each layer spread, dried and, as required, heat-treated at 50 to 200° C. by spin coating, spray coating, doctor blade coating, roll coating, gravure printing, ink jet printing, screen printing or the like.

The transparent substrate is joined to the above layered structure comprising the transparent electroconductive anode layer and the like with an adhesive agent spread on the transparent electroconductive anode layer and/or transparent substrate and dried, as required, at a linear pressure of around 0.1 to $2.94 \times 10^3$ N/m normally by a steel or rubber roll. The adhesive agent can be spread by a common method, e.g., spin coating, spray coating, doctor blade coating, roll coating, gravure printing, screen printing or the like.

The adhesive agent is cured under heating when it is made of a thermosetting resin. When it is made of a UV-curable resin, the flat and smooth substrate or transparent substrate to be irradiated with UV-ray should be made of a UV-transmittable material.

3. Specific Methods for Forming the Transparent Electroconductive Anode Layer

Next, the methods for forming the transparent electroconductive anode layer on the flat and smooth substrate or hole-injection layer are specifically described.

The coating liquid for forming the transparent electroconductive anode layer comprises, as the main components, a solvent and fine electroconductive particles dispersed in the solvent. The fine electroconductive particles may be the fine particles (A) having an average particle diameter of 1 to 100 nm and containing a noble metal, or fine electroconductive oxide particles (B) having an average particle diameter of 1 to 200 nm of granular and/or other non-spherical shapes, e.g., needle or plate shape. The particles (A) are more preferable than the particles (B) for the present invention, viewed from the film characteristics, e.g., resistance and transmittance.

(A) In the Case of Fine Particles Containing a Noble Metal

First, the case of fine particles containing a noble metal is described. A coating liquid for forming the transparent electroconductive anode layer, in which fine particles containing a noble metal are dispersed, can reduce resistance of the film it gives, although slightly deteriorating its transmittance, and is suitable for forming a transparent electroconductive anode layer whose electroconductivity is more important than transmittance.

The fine particles containing a noble metal have an average particle diameter of 1 to 100 nm, preferably 3 to 20 nm, because it is difficult to produce a coating liquid for forming the transparent electroconductive anode layer when it is below 1 nm, and difficult to simultaneously achieve high transmittance and low resistance for the transparent electroconductive anode layer when it is above 100 nm.

The above fine particles preferably contain gold and/or silver, because of their lower resistivity than other noble metals. For example, silver and gold have a respective resistivity of 1.62 and 2.2 μΩ·cm, whereas platinum, rhodium, ruthenium and palladium have a respective resistivity of 10.6, 4.51, 7.6 and 10.8 μΩ·cm. Therefore, use of fine metallic particles containing gold and/or silver is considered to be more advantageous for production of the transparent electroconductive anode layer of low surface resistance.

The fine metallic particles containing silver as the sole noble metal will have limited weather resistance, because they may be significantly deteriorated by oxidation, sulfidation, ultraviolet ray or the like. On the other hand, those containing gold as the sole noble metal is disadvantageous costwise, although free of weather resistance problems. Therefore, a combination of gold and silver is more preferable.

The fine metallic particles containing gold and silver preferably have fine silver particles coated with gold. For example, JP-A-2000-268639 cited earlier discloses a coating liquid for forming a transparent electroconductive anode layer in which fine gold-coated silver particles having an average particle diameter of 1 to 100 nm are dispersed, and also discloses a method for producing the coating liquid. It is preferable to coat the silver particles with gold at 100 to 1900 parts by mass per 100 parts by mass of silver, in consideration of weather resistance.

Another advantage derived from use of gold and/or silver as the noble metal(s) for the fine metallic particles is that the transparent electroconductive anode layer containing these particles has a relatively high work function, in addition to a high transmittance and low resistance, to facilitate injection of the holes therefrom into the light-emitting layer of polymer (or hole-injection layer).

Fine particles containing a noble metal are inherently not transparent to visible light. It is therefore preferable to efficiently provide the electroconductive paths with a minimum quantity of the fine particles, in order to simultaneously achieve high transmittance and low resistance for the transparent electroconductive anode layer. In other words, the transparent electroconductive anode layer, produced by spreading a coating liquid for forming the transparent electroconductive anode layer, preferably has a structure with fine vacancies in the electroconductive layer of fine metallic particles containing a noble metal, i.e., net-work structure. This structure conceivably realizes the transparent electroconductive anode layer of low resistance and high transmittance, because the net-work sections of the fine particles containing a noble metal provide the electroconductive paths, while the vacancies in the structure work to improve light transmittance.

It is preferable, in order to form the net-work structure of fine particles containing a noble metal, that a coating liquid for forming the transparent electroconductive anode layer is prepared beforehand in such a way that the fine particles containing a noble metal are agglomerated to have a chain structure (chain-structured agglomerate of the fine particles containing a noble metal), and that the coating liquid is spread and dried to form the transparent electroconductive anode layer. The agglomerate preferably has an average main chain length of 20 to 500 nm, more preferably 30 to 300 nm. The transparent electroconductive anode layer may have an increased resistance when it is below 20 nm. When it is above 500 nm, on the other hand, the coating liquid for forming the transparent electroconductive anode layer may be difficult to filter and, at the same time, may have deteriorated storage stability.

Moreover, the ratio of average main chain length of the agglomerate to average diameter of the fine particles containing a noble metal (average thickness of the chain-structured agglomerate) is preferably in a range from 3 to 100. The agglomerate having the ratio beyond the above range may cause the problems similar to the above, e.g., difficulty in forming the transparent electroconductive anode layer of high electroconductivity, or difficulty in filtration or deteriorated storage stability of the coating liquid. Average main chain length of the chain-structured agglomerate and average diameter of the fine particles containing a noble metal are determined by transmission electron microscopic (TEM) analysis of the agglomerate.

The coating liquid for forming the transparent electroconductive anode layer may contain a small quantity of binder. The binder-containing coating liquid can give the transparent electroconductive anode layer of high strength, even when it is mono-layered. The binder may be an organic or inorganic one, or a combination thereof. It may be adequately selected according to various parameters, e.g., materials for the flat and smooth substrate and hole-injection layer, and film-making conditions under which the transparent electroconductive anode layer is formed.

The organic binder may be selected from thermoplastic resins, thermosetting resins, resins curable at normal temperature, and resins curable with ultraviolet ray or electron beams. Thermoplastic resins include acryl, polyester (PET), polyolefin, vinyl chloride, polyvinyl butyral, PVP and polyvinyl alcohol resins. Thermosetting resins include epoxy resin. Resins curable at normal temperature include two-component epoxy and urethane resins. Resins curable with ultraviolet ray include resins containing a varying oligomer, monomer or photoinitiator. Resins curable with electron beams include resins containing a varying oligomer or monomer. The useful resins for the present invention are not limited to the above.

The inorganic binders include a binder containing silica sol as the main component. The inorganic binder may contain fine particles of magnesium fluoride, alumina sol, zirconia sol, titania sol, or silica sol partly modified with an organic functional group. The silica sols include, but not limited to, a polymer of ortho alkyl silicate hydrolyzed with water and or an acid catalyst and then dehydropolycondensated, and a polymer produced by dehydropolycondensation of a commercial alkyl silicate solution polymerized to a tetramer or pentamer.

An excessively dehydropolycondensated silicate liquid will become sufficiently viscous to be eventually solidified. Therefore, extent of the dehydropolycondensation should be controlled in such a way that the polymerized silicate liquid has a viscosity not exceeding the upper limit above which it can be no longer spread on a transparent substrate, e.g., of glass or plastic. Extent of the dehydropolycondensation is not limited, so long as the resulting polymer has a viscosity below the upper limit. However, the silicate liquid is preferably polymerized to have a weight-average molecular weight (Mw) of around 500 to 50,000, in consideration of film strength and weather resistance, among others. The alkyl silicate polymer liquid (silica sol), produced by hydrolysis and dehydropolycondensation, is almost completely dehydropolycondensated while the coating liquid for forming the transparent electroconductive anode layer is heat-treated after it is spread and dried, to give the hard silicate film (mainly composed of silicon dioxide).

Next, the method for producing the coating liquid for forming the transparent electroconductive anode layer for the present invention is described, first by taking the coating liquid dispersed with gold-coated silver particles as the fine electroconductive particles.

First, a colloidal dispersion containing fine monodispersed silver particles is prepared by a known method (e.g., Carey-Lea method, Am. J. Sci., 37, 38, 47 (1889)). More specifically, a mixture of aqueous solution of iron (II) sulfate and that of sodium citrate is added to an aqueous solution of silver nitrate, and the resulting precipitate as the reaction product is filtered and washed, to which pure water is added. This produces a colloidal dispersion of fine monodispersed silver particles.

The fine silver particles are coated with gold, when the above colloidal dispersion is incorporated with a reducing solution of hydrazine or the like and aurate solution. In the above gold coating process, the colloidal dispersion of fine silver particles and/or aurate solution may be incorporated with a small quantity of dispersant.

The dispersion is preferably treated by dialysis, electrodialysis, ion-exchanging, ultrafiltration or the like to reduce its electrolyte concentration, otherwise colloidal particles agglomerate each other, this phenomenon known as the Schulze-Hardey phenomenon. The colloidal dispersion of fine gold-coated silver particles of reduced electrolyte concentration is enriched by evaporation under a vacuum, ultrafiltration or the like. Water content of the coating liquid for forming a transparent electroconductive anode layer can be controlled preferably at 1 to 50% by mass by controlling extent of the enrichment.

The enriched dispersion of fine monodispersed gold-coated silver particles is incorporated with a hydrazine solution little by little with stirring, and is kept at room temperature for, e.g., several minutes to several hours, to agglomerate the gold-coated silver particles into chains. Then, the dispersion is incorporated with a hydrogen peroxide solution to decompose hydrazine. This produces the enriched dispersion of fine gold-coated silver particles agglomerated into chains. The phenomenon in which the fine gold-coated silver particles are agglomerated into chains in the presence of hydrazine is not fully substantiated. It is considered that hydrazine works as an alkali ion or as a reducing agent to lower system's electric potential, with the result that the gold-coated silver particles become less stable to agglomerate each other into chains.

In the agglomeration process described above, the fine gold-coated silver particles lose stability (i.e., decrease in zeta potential (absolute value) of the system) when the enriched dispersion of fine gold-coated silver particles is incorporated with a hydrazine ($N_2H_4$) solution, but regain stability (i.e., increase in zeta potential (absolute value) of the system) when the dispersion is incorporated with a hydrogen peroxide ($H_2O_2$) solution to decompose and remove hydrazine, while they are kept agglomerated into chains. Moreover, a series of these reactions produce only water ($H_2O$) and nitrogen gas ($N_2$) without producing any by-product, as, shown in the reaction formula 1 below, and provide a very simple, effective method for producing chain-shape agglomerates of fine gold-coated silver particles.

$$N_2H_4 + 2H_2O_2 \rightarrow 4H_2O + N_2\uparrow \quad \text{Reaction formula 1}$$

The chain-shape agglomerate morphology, e.g., linear or branched shape, can be controlled by controlling various parameters, e.g., fine gold-coated silver particle concentration, hydrazine solution concentration, hydrazine solution addition rate, and stirring velocity and temperature of the reaction liquid, although systematic analysis for controlling their morphologies is not made at present.

A coating liquid for forming a transparent electroconductive anode layer containing chain-shape agglomerates of fine gold-coated silver particles can be produced by incorporating an organic solvent or the like in the enriched dispersion of the above particles. The coating liquid composition is preferably controlled to contain the fine particles at 0.1 to 10% by mass and water at 1 to 50% by mass, the balance being by the organic solvent and others.

A transparent electroconductive anode layer may not exhibit sufficient electroconductive characteristics when it contains the chain-shape agglomerates of fine gold-coated silver particles at below 0.1% by mass. At above 10% by mass, on the other hand, the particles may be unstable, tending to agglomerate each other. When it contains water at below 1% by mass, by which is meant that enrichment extent of the fine gold-coated silver particle dispersion is increased, the particles may be unstable tending to agglomerate each other, because of the excessively increased particle concentration, as discussed above. Conversely, the coating liquid may drastically lose coatability at a water concentration above 50% by mass.

(B) In the Case of Fine Electroconductive Oxide Particles

Next, the case of fine electroconductive oxide particles as the fine electroconductive particles for forming the transparent electroconductive anode layer is described. Fine particles containing an oxide selected from the group consisting of indium oxide, tin oxide and zinc oxide can be used as the fine electroconductive oxide particles.

More specifically, the fine electroconductive oxide particles useful for the present invention include those of indium tin oxide (ITO), indium zinc oxide (IZO), indium tungsten oxide (IWO), indium titanium oxide (ITiO), indium zirconium oxide, tin antimony oxide (ATO), fluorine-doped tin oxide (FTO), aluminum zinc oxide (AZO) and gallium zinc oxide (GZO). The oxides are not limited to the above, and any oxide may be used so long as it simultaneously has transparency and electroconductivity.

Of the above oxides, ITO is more suitable for a coating liquid for forming a transparent electroconductive anode layer in consideration of its high transmittance and electroconductivity. The fine electroconductive oxide particles have an average particle diameter of 1 to 200 nm, preferably 10 to 50 nm, when they are granular, because it may be difficult to produce a coating liquid for forming a transparent electroconductive anode layer and the film made from the coating liquid may have a drastically increased resistance when it is below 1 nm, and the transparent electroconductive anode layer of these particles may difficult to simultaneously satisfy high transmittance and low resistance when it is above 200 nm. The average particle diameter described above is determined by a transmission electron microscope (TEM).

When fine granular and/or other non-spherical shapes (e.g., needle or plate shape) are used for the fine electroconductive oxide particles, they have a size (represented by length for a needle shape, and width for a plate shape) of 0.1 to 100 μm, preferably 0.2 to 10 μm, and preferably have an aspect ratio (length/width ratio for a needle shape, and width/thickness ratio for a plate shape) of around 5 to 30, because fine particles having a size below 0.1 μm are themselves difficult to produce and a film of these particles will have a drastically increased resistance, and those having a size above 100 μm are difficult to achieve a low resistance in a high transmittance region(thin film).

Fine non-spherical electroconductive oxide particles (e.g., needle or plate shape particles) themselves are inapplicable to the conventional method for forming a hole-injection or light-emitting layer of polymer on a transparent electroconductive anode layer, which needs an anode layer of very high flatness. By contrast, these particles are applicable to the method of the present invention, because the anode layer has a very flat and smooth surface transferred from a flat and smooth substrate.

Next, the method is described for producing a coating liquid for forming a transparent electroconductive anode layer for the present invention, in which fine electroconductive oxide particles are used.

The fine electroconductive oxide particles are treated for dispersion, after being incorporated with a dispersant and solvent. The dispersants include various coupling agents, e.g., silicon-based one, polymer dispersants and surfactants, e.g., anionic, nonionic and cationic ones. An adequate dispersant is selected according to type of the fine electroconductive oxide particles used and method for dispersing them. These particles may be well dispersed in the absence of any dispersant, depending on combination of the particles and solvent, and method for dispersing them. A dispersant may deteriorate electrical resistance and weather resistance of the film in which the particles are used, and a coating liquid which needs no dispersant for forming a transparent electroconductive layer is most desirable.

The dispersion treatment may be carried out by a common method or apparatus, e.g., ultrasonic treatment, homogenizer, paint shaker, bead mill or the like.

A coating liquid containing fine electroconductive oxide particles for forming a transparent electroconductive anode layer is prepared by incorporating a solvent or the like in the (enriched) dispersion of the fine electroconductive oxide particles, prepared above, and adjusting concentrations of the components, e.g., fine electroconductive particles and solvent. The coating liquid composition is preferably adjusted to contain the fine electroconductive oxide particles at 1 to 70% by mass, the balance being by the solvent, additive(s) and the like.

A transparent electroconductive layer may not exhibit sufficient electroconductive characteristics when it contains the fine electroconductive oxide particles at below 1% by mass. At above 70% by mass, on the other hand, the (enriched) dispersion of the fine electroconductive oxide particles may be difficult to prepare. A specific content of these particles may be adequately set within the above range according to the coating method adopted.

The solvent for the coating liquid for forming the transparent electroconductive anode layer is not limited, and may be adequately selected according to the coating method and film-making conditions adopted.

More specifically, these solvents include, but not limited to, water; alcohol-based solvents, e.g., methanol (MA), ethanol (EA), 1-propanol (NPA), isopropanol (IPA), butanol, pentanol, benzyl alcohol and diacetone alcohol (DAA); ketone-based solvents, e.g., acetone, methylethylketone (MEK), methylpropylketone, methylisobutylketone (MIBK), cyclohexanone and isophorone; glycol derivatives, e.g., ethylene glycol monomethyl ether (MCS), ethylene glycol monoethyl ether (ECS), ethylene glycol isopropyl ether (IPC), propylene glycol methyl ether (PGM), propylene glycol ethyl ether (PE), propylene glycol methyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether and dipropylene glycol monobutyl ether; and benzene derivatives, e.g., toluene, xylene, mesitylene and dodecylbenzene; and other solvents, e.g., formamide (FA), N-methylformamide, dimethylformamide (DMF), dimethylacetoamide, dimethylsulfoxide (DMSO), N-methyl-2-pyrrolidone (NMP), ethylene glycol, diethylene glycol, tetrahydrofuran (THF), and chloroform.

These solvents may be used for coating liquids for forming the hole-injection, transparent coat and polymer light-emitting layers within limits not harmful to solubility or dispersibility of the materials for these layers.

The transparent electroconductive layered structure of the present invention, prepared by the above-described procedure, comprises at least a transparent electroconductive anode layer formed by a coating method on a flat and smooth substrate, and transparent substrate joined to the other side of the anode layer via an adhesive layer, wherein the flat and smooth substrate can be released from the transparent electroconductive layered structure. The flat and smooth substrate leaves behind a flat and smooth surface. Therefore, the layered structure can be used as a member for an organic EL device which includes a light-emitting layer of polymer, because the light-emitting layer can be formed on the flat and smooth surface left by the flat and smooth substrate.

4. Method for Producing the Organic EL Device

The organic EL device of the present invention is produced by the method which releases the flat and smooth substrate from the transparent electroconductive layered structure produced by the above-described procedure, spreads a coating liquid, containing a solvent and high-molecular-weight light-emitting material or precursor therefor, for forming a light-emitting layer of polymer on the surface of the transparent electroconductive anode layer or hole-injection layer left by the flat and smooth substrate, dries the coating liquid to form the light-emitting layer of polymer on the surface, and forms a cathode layer on the light-emitting layer.

In other words, when the organic EL device is produced by the method of the present invention, the flat and smooth substrate is first released from the transparent electroconductive layered structure. Then, the coating liquid for forming the light-emitting layer of polymer is spread and dried on the flat and smooth surface of the transparent electroconductive anode layer or hole-injection layer left by the flat and smooth substrate to form the light-emitting layer of polymer on the surface. Finally, the cathode layer is formed on the light-emitting layer. In this way, the organic EL device can be produced by the method of the present invention.

Releasability of the flat and smooth substrate from the transparent electroconductive anode layer or hole-injection layer is determined by material of the substrate, and also by type of the adhesive agent and components of the coating liquid for forming the transparent coat layer, because the adhesive agent or coating liquid may reach the substrate surface, when it soaks through the anode layer or when the anode layer is formed by patterning. However, when the flat and smooth substrate is made of glass, a plastic or metal having a common flat and smooth surface, the conditions can be easily realized for the substrate to be easily released from the interface with the transparent electroconductive anode layer or hole-injection layer formed by a coating method.

The condition that the flat and smooth substrate can be easily released means that it can be released from the transparent electroconductive layered structure when pulled slightly by a force applied to between itself and the transparent substrate to separate them from each other without leaving its component on the transparent electroconductive anode layer or hole-injection layer. Therefore, a special procedure is not necessary to release the substrate. For example, it can be released by a Roll-to-Roll method in a mass production system while being wound around the roll. However, the releasing conditions should be carefully set not to leave any damage on the film.

Next, the light-emitting layer of polymer is formed on the surface left by the flat and smooth substrate, for which a coating method can be adopted. More specifically, a coating liquid for forming the light-emitting layer of polymer is spread by an adequate method, e.g., spin coating, spray coating, doctor blade coating, roll coating, gravure printing, ink jet printing, screen printing or the like, dried and, as required, heat-treated at, e.g., around 50 to 200° C., to form the light-emitting layer.

The coating liquid for the present invention for forming the light-emitting layer of polymer comprises a solvent and high-molecular-weight light-emitting material or precursor therefor.

When a high-molecular-weight light-emitting material is used, the light-emitting layer of polymer can be simply formed by just spreading and drying a coating liquid for forming the light-emitting layer. The high-molecular-weight light-emitting materials include those based on poly-p-phenylenevinylene (PPV), polyphenylene, polyfluorene and polyvinylcarbazole, which may be incorporated with a low-molecular-weight fluorescent colorant (e.g., coumarin, perylene, rhodamine or a derivative thereof. The high-molecular-weight light-emitting materials useful for the present invention are not limited to the above, so long as they are soluble in a solvent and spreadable to form a film.

When a high-molecular-weight light-emitting material precursor is used, on the other hand, it is necessary to heat-treat the coating liquid, after it is spread and dried, at an elevated temperature, e.g., around 200° C., to convert the precursor into a high-molecular-weight material by polymerization. These precursors generally used include, but not limited to, those for poly-p-phenylenevinylene (PPV).

The cathode layer to be formed on the light-emitting layer of polymer is preferably made of a metal of low work function, such as an alkali metal, e.g., lithium (Li), potassium (K) or sodium (Na), alkali-earth metal, e.g., magnesium (Mg) or calcium (Ca), or aluminum (Al). A combination of the above metal and a highly stable metal, e.g., indium (In) or silver (Ag), either in the form of mixture (or alloy) or layered structure, in consideration of stability of the cathode layer.

The cathode layer can be formed by a known method, e.g., vacuum evaporation, sputtering, ion plating or the like. It is preferable to place a thin film (around several nm thick) of lithium fluoride (LiF), magnesium fluoride ($MgF_2$) or the like between the cathode layer and light-emitting layer of polymer, viewed from improved electron injection characteristics.

As discussed above, the transparent electroconductive layered structure of the present invention is applicable to an organic EL device having the light-emitting layer formed with a coating liquid for forming a light-emitting layer of polymer. It is needless to say that the layered structure is applicable to an organic EL device having the light-emitting layer formed by vacuum evaporation or the like of a low-molecular-weight light-emitting material, where it can similarly effectively prevent troubles, e.g., short circuit between the electrodes and dielectric breakdown of the light-emitting layer.

5. Organic EL Device

The organic EL device of the present invention includes the transparent electroconductive layered structure of the present invention and is produced by the method described above. It has a structure with a light-emitting layer of polymer formed by a coating method and cathode layer, in this order, on the surface left by the flat and smooth substrate, to which the flat and smooth surface of the substrate is transferred.

The organic EL device having the basic structure shown in FIG. 2, for example, comprises the transparent substrate 4, adhesive layer 3, transparent electroconductive anode layer 2 formed by a coating method, light-emitting layer of polymer 6 and cathode layer 7. In this organic EL device of the present invention, even when the projection 9 is evolved in the transparent electroconductive anode layer 2 as a result of defective coating, caused by, e.g., primary or agglomerated secondary coarse electroconductive particles, uneven coating, or foreign matter, it projects to the adhesive layer 3 side and exerts no effect on the interface between the light-emitting layer 6 of polymer and transparent electroconductive anode layer 2 on the other side. Therefore, it can effectively prevent troubles, e.g., short circuit between the electrodes and dielectric breakdown of the light-emitting layer 6 of polymer.

The other structures of the organic EL device of the present invention have a hole transfer layer between the hole injection layer 5 and light-emitting layer 6 of polymer, a hole transfer layer which also works as the hole injection layer 5, and/or an electron transfer layer between the cathode layer 7 and light-emitting layer 6 of polymer. The hole transfer or electron transfer layer works to further enhance light-emitting efficiency, because it efficiently recombine the holes and electrons as the carriers injected into the light-emitting layer 6 of polymer.

Figure 9:
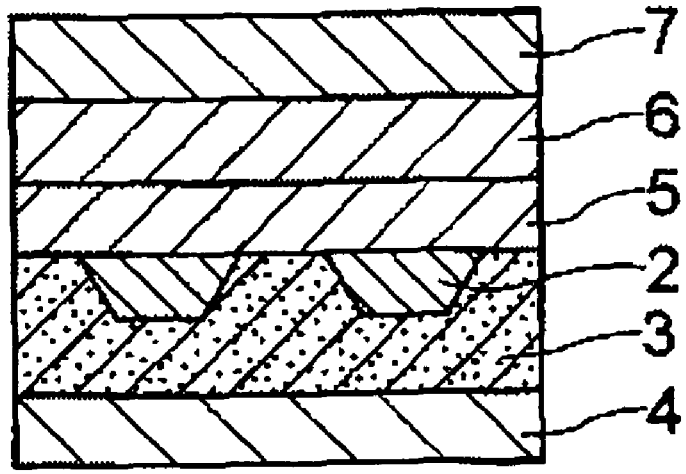
FIG. 9 is a sectional view of the organic EL device of the present invention illustrating its patterned transparent electroconductive anode layer.

Moreover, the organic EL device may have the transparent electroconductive anode layer treated to have a given pattern, depending on its purposes. Referring to FIG. 9, for example, the transparent electroconductive anode layer 2 of the organic EL device of the present invention is formed by a coating method on the hole-injection layer 5, when it is spread and dried to have a given pattern by a printing method or the like. Therefore, the irregularities evolved between the patterned and unpatterned portions are invariably present on the adhesive layer 3 side opposite to the hole-injection layer 6 side, keeping the interfacial plane between the transparent electroconductive anode layer 2 and hole-injection layer 5 flat and smooth, free of irregularities. Therefore, patterning the transparent electroconductive anode layer 2 exerts no harmful effect on thickness uniformity of the hole-injection layer 6 and light-emitting layer 5 of polymer.

Figure 11:
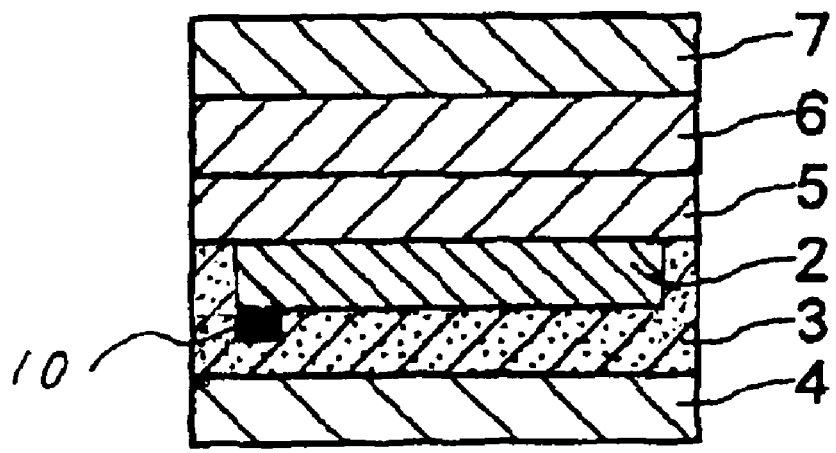
FIG. 11 is a sectional view of the organic EL device of the present invention illustrating its transparent electroconductive anode layer provided with an auxiliary electrode layer.

Still more, the transparent electroconductive anode layer formed by patterning may be partly provided with a metallic auxiliary electrode. For example, referring to FIG. 11, the metallic auxiliary electrode 10 composed of fine metallic particles of gold, silver, copper or the like and a solvent (solvents) (a binder may be also contained) may be formed by printing and curing a paste for forming the metallic auxiliary electrode on part of the transparent electroconductive anode layer 2, formed by printing or the like to have a given pattern and dried. As described above, these transparent electroconductive anode layer 2 and metallic auxiliary electrode 10, even when formed by patterning, give a flat and smooth interfacial plane free of irregularities for the reason described above, and exert no harmful effect on thickness uniformity of the hole-injection layer 5 and light-emitting layer 6 of polymer.

Figure 10:
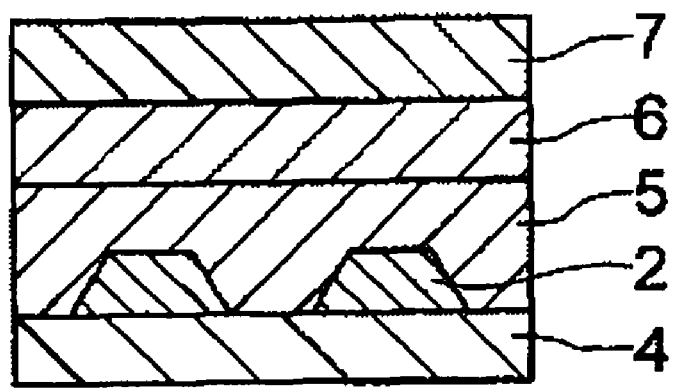
FIG. 10 is a sectional view of a conventional organic EL device illustrating its patterned transparent electroconductive anode layer.

FIG. 10 shows an organic EL device produced by a conventional method, which forms the transparent electroconductive anode layer 2 and hole-injection layer 5, in this order, on the transparent substrate 4. Therefore, irregularities in the transparent electroconductive anode layer 2 formed by patterning appear on the side opposite to the transparent substrate 4, whether the layer 2 is formed by a coating method or physical method, e.g., sputtering. When the electroconductive anode layer is formed by a coating method, in particular, difference between the irregularities of the layer becomes larger, because the edges are not sharper and, at the same time, slowly slanted.

Therefore, the organic EL device produced by a conventional method has the layers of uneven thickness, when the hole-injection layer 5 and light-emitting layer 6 of polymer are formed on the transparent electroconductive anode layer 2 having irregularities on the surface, as discussed above, tending to cause various troubles, e.g., short circuit between the electrodes, dielectric breakdown of the light-emitting layer 6 of polymer, uneven brightness of emitted light. FIG. 10 draws a flat interface between two of the hole-injection layer 5, light-emitting layer 6 of polymer and cathode layer 7 for descriptive purposes. In actuality, however, irregularities are evolved under the influence of the patterned transparent electroconductive anode layer 2 to cause uneven thickness of the hole-injection layer 5 and light-emitting layer 6 of polymer.

By contrast, the organic EL device of the present invention is free of irregularities or projections of the transparent electroconductive anode layer on the cathode layer side, although the anode layer is formed by a simple coating method, and causes no short circuit between the anode and cathode layers. Therefore, the present invention can provide an organic EL device which can be produced by a simple coating method capable of forming a film at a low temperature, is inexpensive and has a light-emitting layer of polymer resistant to deterioration. As such, it is applicable to a light source (e.g., liquid-crystal device's back light) and display.

EXAMPLES

The present invention is described in more detail by EXAMPLES, which by no means limit the present invention. In the following description, "%" means "% by mass" except for transmittance and haze.

Example 1

First, a colloidal dispersion of fine silver particles was prepared by the Carey-Lea method in accordance with the procedure described above. It was then treated by coating the fine silver particles with gold, desalting, agglomeration, enrichment, compositional adjustment and so on, to prepare a coating liquid for forming the transparent electroconductive anode layer containing fine gold-coated silver particles.

The coating liquid for forming the transparent electroconductive anode layer had the following composition, fine Au-coated Ag particles (Ag/Au ratio: ¼ by mass): 0.5%, water: 10.6%, ethanol (EA): 63.85%, propylene glycol methyl ether (PGM): 15.0%, diacetone alcohol (DAA): 10.0% and formamide (FA): 0.05%.

The fine Au-coated Ag particles were composed of the primary particles (diameter: around 6.5 nm) agglomerated to have a chain structure, partly branched, as observed by transmission electron microscopy for the coating liquid for forming the transparent electroconductive anode layer. The chain-structured agglomerates had a length (maximum main chain length of the individual fine Au-coated Ag particle agglomerates) of 100 to 500 nm.

A PET film (Teijin, 100 μm thick) was used for the flat and smooth substrate. It was first pre-heated at 40° C., then coated with the above-described coating liquid by spin coating (130 rpm, 100 seconds), and heat-treated at 120° C. for 10 minutes, to form the transparent electroconductive anode layer on the flat and smooth substrate. The anode layer had the following film characteristics, visible light transmittance: 77%, haze: 0.1% and surface resistivity: 140 Ω/square (ohm per square).

The transparent electroconductive anode layer was then coated with an acryl-based UV-curable adhesive agent (Toagosei, UV-3701®) to an average thickness of 3 μm, joined to a glass substrate (soda lime glass, 1 mm thick) as the transparent substrate, and irradiated with light from a high-voltage mercury lamp to cure the adhesive agent, to prepare the transparent electroconductive layered structure of EXAMPLE 1 comprising the flat and smooth substrate/transparent electroconductive anode layer/adhesive layer/transparent substrate. The layered structure had the PET film as the flat and smooth substrate easily released from the transparent electroconductive anode layer at the joint interface.

The transparent electroconductive anode layer in the transparent electroconductive layered structure was coated, on the flat and smooth surface left by the PET film as the flat and smooth substrate, with a coating liquid for forming the light-emitting layer of polymer by spin coating (150 rpm, 60 seconds), after the transparent substrate was pre-heated at 40° C., and then heat-treated at 80° C. for 60 minutes under a vacuum, to form the light-emitting layer of polymer. The coating liquid for forming the light-emitting layer of polymer was composed of 0.25% of poly[2-methoxy-5-(3',7'-dimethyloctyloxy)-1,4-phenylenevinylene] and 99.75% of toluene. The flat and smooth surface of the transparent electroconductive anode layer, left by the flat and smooth substrate, had a surface roughness Ra of 5.4 nm.

The light-emitting layer of polymer was coated with calcium (Ca) and silver (Ag) in this order by vacuum evaporation to form the 2-layered cathode layer of Ca and Ag (size: 1 by 1.5 cm). This produced the organic EL device of EXAMPLE 1. The organic EL device was confirmed to emit light of orange color, when a DC voltage of 15 V was applied to between the transparent electroconductive anode layer and cathode layer (anode: +, cathode: −).

The above-described transmittance and haze values of the transparent electroconductive anode layer, determined by the following calculation formulae, were those of the anode layer alone.

Transmittance (%) of the transparent electroconductive anode layer=[(transmittance of the individual layered structure, measured after the anode layer was formed)/(transmittance of the layered structure or substrate, measured before the anode layer was formed)]×100   Calculation formula 1

Haze (%) of the transparent electroconductive anode layer=[(haze of the individual layered structure, measured after the anode layer was formed)−(haze of the layered structure or substrate, measured before the anode layer was formed)]   Calculation formula 2

Surface resistivity of the transparent electroconductive anode layer was measured by a surface resistance meter (Mitsubishi Chemical, Loresta AP (MCP-T400). Visible light transmittance and haze value were measured by a haze meter (Murakami Color Research Laboratory, HR-200). The chain-structured agglomerates of the fine gold-coated silver particles were observed by a transmission electron microscope (JOEL) for the shape and size (length).

Example 2

A dispersion of polyethylene dioxythiophene doped with polystyrene sulfonic acid (PEDOT: PSS, Bayer, Baytron P-VP-CH8000) was diluted with an organic solvent to prepare a coating liquid for forming the hole-injection layer. The coating liquid had the following composition, BaytronP-VP-CH8000: 20.0%, γ-glycidoxypropyltrimethoxysilane: 1.0%, N-methyl-2-pyrrolidone: 1.5%, PGM: 5.0% and isopropyl alcohol (IPA): 72.5%.

A PET film (Teijin, 100 μm thick) was used for the flat and smooth substrate. It was first pre-heated at 40° C., then coated with the above-described coating liquid by spin coating (150 rpm, 100 seconds), and heat-treated at 120° C. for 10 minutes, to form the hole-injection layer.

Then, the flat and smooth substrate with the hole-injection layer was pre-heated at 40° C., and the hole-injection layer was coated with the same coating liquid for forming the transparent electroconductive anode as that used in EXAMPLE 1 by spin coating (130 rpm, 100 seconds), and heat-treated at 120° C. for 10 minutes, to form the transparent electroconductive anode layer. The anode layer had the following film characteristics, visible light transmittance: 75%, haze: 0.2% and surface resistivity: 200 Ω/square, determined in the same manner as in EXAMPLE 1.

The transparent electroconductive anode layer was then coated with an epoxy-based adhesive agent (TESK, C-1064®) to an average thickness of 10 μm, joined to a glass substrate (soda lime glass, 1 mm thick) as the transparent substrate, and treated to cure the adhesive agent, to prepare the transparent electroconductive layered structure of EXAMPLE 2 comprising the flat and smooth substrate/hole-injection layer/transparent electroconductive anode layer/adhesive layer/transparent substrate. The layered structure had the PET film as the flat and smooth substrate easily released from the hole-injection layer at the joint interface.

The transparent electroconductive anode layer in the transparent electroconductive layered structure was coated, on the flat and smooth surface left by the PET film as the flat and smooth substrate, with the same coating liquid for forming the light-emitting layer of polymer as that used in EXAMPLE 1 by spin coating (150 rpm, 60 seconds), after the transparent substrate was pre-heated at 40° C., and then heat-treated at 80° C. for 60 minutes under a vacuum, to form the light-emitting layer of polymer. The flat and smooth surface of the transparent electroconductive anode layer, left by the flat and smooth substrate, had a surface roughness Ra of 5.6 nm.

The light-emitting layer of polymer was coated with calcium (Ca) and silver (Ag) in this order by vacuum evaporation to form the 2-layered cathode layer of Ca and Ag (size: 1 by 1.5 cm). This produced the organic EL device of EXAMPLE 2. The organic EL device was confirmed to emit light of orange color, when a DC voltage of 15 V was applied to between the transparent electroconductive anode layer and cathode layer (anode: +, cathode: −).

Example 3

The flat and smooth substrate was coated with the hole-injection layer and transparent electroconductive anode layer in this order in the same manner as in EXAMPLE 2, and then with a coating liquid for forming a transparent coat layer, composed of a silica sol liquid as the main component, by spin coating (130 rpm, 80 seconds), and heat-treated at 120° C. for 10 minutes, to form the transparent coat layer. The 2-layered film of the transparent electroconductive anode layer/transparent coat layer had the following film characteristics, visible light transmittance: 76%, haze: 0.2% and surface resistivity: 180 Ω/square, determined in the same manner as in EXAMPLE 1.

The coating liquid for forming the transparent coat layer had the following composition, silica sol liquid ($SiO_2$ content: 10%): 5.0%, γ-mercaptopropyltrimethoxy silane: 0.005%, PGM: 10.0%, DAA: 5.0% and EA: 79.9%. The silica sol liquid was adjusted to have a SiO2 (silicon dioxide) concentration of 10% and weight-average molecular weight (Mw) of 1400 with 19.6 parts of methyl silicate 51 (COLCOAT, ®), 57.8 parts of ethanol, 7.9 parts of a 1% aqueous nitric acid solution and 14.7 parts of pure water.

The transparent coat layer was then coated with an epoxy-based adhesive agent (TESK, C-1064®) to an average thickness of 10 μm, joined to a glass substrate (soda lime glass, 1 mm thick) as the transparent substrate, and treated to cure the adhesive agent, to prepare the transparent electroconductive layered structure of EXAMPLE 3 comprising the flat and smooth substrate/hole-injection layer/transparent electroconductive anode layer/transparent coat layer/adhesive layer/transparent substrate. The layered structure had the PET film as the flat and smooth substrate easily released from the hole-injection layer at the joint interface.

The light-emitting layer of polymer and 2-layered cathode layer of Ca and Ag were formed on the transparent electroconductive layered structure in the same manner as in EXAMPLE 2, after the flat and smooth substrate was released therefrom, to produce the organic EL device of EXAMPLE 3. The organic EL device was confirmed to emit light of orange color, when a DC voltage of 15 V was applied to between the transparent electroconductive anode layer and cathode layer. The flat and smooth surface of the transparent electroconductive anode layer (anode: +, cathode: −), left by the flat and smooth substrate, had a surface roughness Ra of 5.6 nm.

Comparative Example 1

A glass substrate (soda lime glass, 1 mm thick), pre-heated at 40° C., was coated with the same coating liquid for forming the transparent electroconductive anode as that used in EXAMPLE 1 by spin coating (130 rpm, 100 seconds), and heat-treated at 120° C. for 10 minutes, to form the transparent electroconductive anode layer on the glass substrate. The anode layer had the following film characteristics, visible light transmittance: 77%, haze: 0.1% and surface resistivity: 125 Ω/square.

Then, the transparent electroconductive anode layer was coated with the same coating liquid for forming the light-emitting layer of polymer as that used in EXAMPLE 1 by spin coating (150 rpm, 60 seconds), after the glass substrate on which the anode layer was formed was pre-heated at 40° C., and then heat-treated at 80° C. for 60 minutes under a vacuum, to form the light-emitting layer of polymer. The light-emitting layer of polymer was coated with the 2-layered cathode layer of Ca and Ag (size: 1 by 1.5 cm) in the same manner as in EXAMPLE 1, to produce the organic EL device of COMPARATIVE EXAMPLE 1, which included neither flat and smooth substrate nor adhesive layer.

A total of the 10 organic EL devices of COMPARATIVE EXAMPLE 1 were prepared in the same manner as described above, and a DC voltage of 15 V was applied to between the transparent electroconductive anode layer and cathode layer (anode: +, cathode: −) of each device. All of these devices failed to emit light, because of a short circuit between the anode and cathode layers.

Example 4

First, 60 g of fine ITO particles having an average particle diameter of 30 nm (Sumitomo Metal Mining, SUFP-HX®) were dispersed in 40 g of isophorone as a solvent to prepare the coating liquid for forming the transparent electroconductive anode layer, in which the fine ITO particles having an average dispersed particle size (diameter) of 110 nm.

A PET film (Teijin, 100 μm thick) was used for the flat and smooth substrate. It was coated with the above coating liquid by wire bar coating (wire diameter: 0.3 mm), and heat-treated at 40° C. for 15 minutes and then 120° C. for 30 minutes, to form the transparent electroconductive anode layer (film thickness: 3 μm) composed of the fine ITO particles on the flat and smooth substrate. The anode layer had the following film characteristics, visible light transmittance: 80.3%, haze: 3.2% and surface resistivity: 4500 Ω/square.

The transparent electroconductive anode layer was then coated with an acryl-based UV-curable adhesive agent (Toagosei, UV-3701®) to an average thickness of 3 μm, joined to a glass substrate (soda lime glass, 1 mm thick) as the transparent substrate, and irradiated with UV-light from a high-voltage mercury lamp to cure the adhesive agent, to prepare the transparent electroconductive layered structure of EXAMPLE 4 comprising the flat and smooth substrate/transparent electroconductive anode layer/adhesive layer/transparent substrate. The layered structure had the PET film as the flat and smooth substrate easily released from the transparent electroconductive anode layer at the joint interface.

The transparent electroconductive anode layer with the flat and smooth surface, left by the flat and smooth substrate released from the transparent electroconductive layered structure, had the following film characteristics, visible light transmittance: 82.2%, haze: 2.0% and surface resistivity: 800 Ω/square (the haze and surface resistivity levels improved because of the UV-curable adhesive agent penetrating into the voids between the fine ITO particles in the transparent electroconductive anode layer). The flat and smooth surface of the transparent electroconductive anode layer, left by the flat and smooth substrate, had a surface roughness Ra of 5.5 nm.

The transparent electroconductive anode layer in the transparent electroconductive layered structure was coated, on the flat and smooth surface left by the flat and smooth substrate (PET film), with the same coating liquid for forming the light-emitting layer of polymer as that used in EXAMPLE 1 by spin coating (150 rpm, 60 seconds), after the transparent substrate was pre-heated at 40° C., and then heat-treated at 80° C. for 60 minutes under a vacuum, to form the light-emitting layer of polymer.

The light-emitting layer of polymer was coated with calcium (Ca) and silver (Ag) in this order by vacuum evaporation to form the 2-layered cathode layer of Ca and Ag (size: 0.5 by 0.5 cm). This produced the organic EL device of EXAMPLE 4. The organic EL device was confirmed to emit light of orange color, when a DC voltage of 15 V was applied to between the transparent electroconductive anode layer and cathode layer (anode: +, cathode: −).

The fine electroconductive oxide particles were observed by a transmission electron microscope (JOEL) to determine the average particle size. Dispersed particle size (diameter) of the fine electroconductive particles in the coating liquid for forming the transparent electroconductive anode layer was determined by a laser-scattering particle size analyzer (Otsuka Electronics, ELS-800).

Example 5

The hole-injection layer was formed on a PET film (Teijin, 100 µm thick) as the flat and smooth substrate in the same manner as in EXAMPLE 2.

The transparent electroconductive layered structure of EXAMPLE 5, comprising the flat and smooth substrate/hole-injection layer/transparent electroconductive anode layer/adhesive layer/transparent substrate, was prepared in the same manner as in EXAMPLE 2, except that the hole-injection layer was coated with the same coating liquid for forming the transparent electroconductive anode as that used in EXAMPLE 4. The layered structure had the PET film as the flat and smooth substrate easily released from the hole-injection layer at the joint interface. The flat and smooth surface of the hole-injection layer, left by the flat and smooth substrate, had a surface roughness Ra of 5.6 nm.

The hole-injection layer in the transparent electroconductive layered structure was coated, on the flat and smooth surface left by the flat and smooth substrate (PET film), with the same coating liquid for forming the light-emitting layer of polymer as that used in EXAMPLE 1 by spin coating (150 rpm, 60 seconds), after the transparent substrate was pre-heated at 40° C., and then heat-treated at 80° C. for 60 minutes under a vacuum, to form the light-emitting layer of polymer.

The light-emitting layer of polymer was coated with calcium (Ca) and silver (Ag) in this order by vacuum evaporation to form the 2-layered cathode layer of Ca and Ag (size: 0.5 by 0.5 cm). This produced the organic EL device of EXAMPLE 5. The organic EL device was confirmed to emit light of orange color, when a DC voltage of 15 V was applied to between the transparent electroconductive anode layer and cathode layer (anode: +, cathode: −).

Example 6

First, 60 g of fine ITO particles having an average particle diameter of 30 nm (Sumitomo Metal Mining, SUFP-HX®) were dispersed in 70 g of isophorone as a solvent in the presence of 10 g of a polyester resin (TOYOBO, VYLON®) to prepare the coating liquid for forming the transparent electroconductive anode layer, in which the fine ITO particles having an average dispersed particle size (diameter) of 130 nm.

The hole-injection layer was formed on a PET film (Teijin, 100 µm thick) as the flat and smooth substrate in the same manner as in EXAMPLE 2.

Then, the hole-injection layer was coated with the above coating liquid by screen printing, and heat-treated at 40° C. for 15 minutes and then 120° C. for 30 minutes, to form the transparent electroconductive anode layer in the form of line groups, each 1 mm wide. The anode layer had the following film characteristics, visible light transmittance: 91.0%, haze: 5.8% and surface resistivity: 950 Ω/square.

The transparent electroconductive layered structure of EXAMPLE 6, comprising the flat and smooth substrate/hole-injection layer/auxiliary electrode layer and transparent electroconductive anode layer/adhesive layer/transparent substrate, was prepared in the same manner as in EXAMPLE 6, except that the transparent electroconductive anode layer was coated with paste (Sumitomo Metal Mining, DCG-310C-CN20) for forming the auxiliary electrode comprising colloidal silver particles having an average particle diameter of 30 nm and a solvent as the main components, and heat-treated at 120° C. for 30 minutes, to form the opaque auxiliary electrode in the form of line groups (width: 0.2 mm, thickness: 3 µm) having a surface resistivity of 0.08 Ω/square. The layered structure had the PET film as the flat and smooth substrate easily released from the hole-injection layer at the joint interface.

The hole-injection layer in the transparent electroconductive layered structure was coated, on the flat and smooth surface left by the flat and smooth substrate (PET film), with the same coating liquid for forming the light-emitting layer of polymer as that used in EXAMPLE 1 by spin coating (150 rpm, 60 seconds), after the transparent substrate was pre-heated at 40° C., and then heat-treated at 80° C. for 60 minutes under a vacuum, to form the light-emitting layer of polymer. The flat and smooth surface of the hole-injection layer, left by the flat and smooth substrate, had a surface roughness Ra of 5.6 nm.

The light-emitting layer of polymer was coated with calcium (Ca) and silver (Ag) in this order by vacuum evaporation to form the 2-layered cathode layer of Ca and Ag (size: 0.5 by 0.5 cm). This produced the organic EL device of EXAMPLE 6. The organic EL device was confirmed to emit light of orange color, when a DC voltage of 15 V was applied to between the transparent electroconductive anode layer and cathode layer (anode: +, cathode: −).

Example 7

First, 60 g of fine needle-shape ITO particles having an average length of 250 nm, average width of 30 nm, (Dowa Mining) were dispersed in 70 g of isophorone as a solvent in the presence of 20 g of an acrylic resin (Mitsubishi Rayon, Dianal® BR83) to prepare the coating liquid for forming the transparent electroconductive anode layer, in which the fine ITO particles having an average particle diameter of 180 nm were dispersed.

The hole-injection layer was formed on a PET film (Teijin, 100 µm thick) as the flat and smooth substrate in the same manner as in EXAMPLE 2.

The hole-injection layer was coated with the coating liquid for forming the transparent electroconductive anode layer by wire bar coating (wire diameter: 0.4 mm), and heat-treated at 40° C. for 15 minutes and then 120° C. for 30 minutes, to form the transparent electroconductive anode layer (film thickness:

3 μm) composed of the fine ITO particles on the hole-injection layer. The anode layer had the following film characteristics, visible light transmittance: 81.0%, haze: 18.9% and surface resistivity: 1500 Ω/square.

The transparent electroconductive layered structure of EXAMPLE 7 comprising the flat and smooth substrate/hole-injection layer/transparent electroconductive anode layer/adhesive layer/transparent substrate was prepared in the same manner as in EXAMPLE 5, except for the coating liquid for forming the transparent electroconductive anode layer described above. The layered structure had the PET film as the flat and smooth substrate easily released from the hole-injection layer at the joint interface. The flat and smooth surface of the hole-injection layer, left by the flat and smooth substrate, had a surface roughness Ra of 5.6 nm.

The light-emitting layer of polymer and cathode layer were formed in the same manner as in EXAMPLE 5, to produce the organic EL device of EXAMPLE 7. The organic EL device was confirmed to emit light of orange color, when a DC voltage of 15 V was applied to between the transparent electroconductive anode layer and cathode layer (anode: +, cathode: −).

The fine electroconductive oxide particles were observed by a transmission electron microscope (JOEL) to determine the particle shape. Dispersed particle size (diameter) of the fine electroconductive particles in the coating liquid for forming the transparent electroconductive anode layer was determined by a laser-scattering particle size analyzer (Otsuka Electronics, ELS-800).

Example 8

The transparent electroconductive layered structure of EXAMPLE 8 comprising the flat and smooth substrate/hole-injection layer/transparent electroconductive anode layer/adhesive layer/transparent substrate was prepared in the same manner as in EXAMPLE 5, except that the adhesive agent incorporated with a dehydrating agent of fine silica gel particles was spread to an average thickness of 100 μm. The layered structure had the PET film as the flat and smooth substrate easily released from the hole-injection layer at the joint interface. It was confirmed that the adhesive agent was substantially free of moisture due to the dehydrating agent. The flat and smooth surface of the hole-injection layer, left by the flat and smooth substrate, had a surface roughness Ra of 5.6 nm.

The light-emitting layer of polymer and cathode layer were formed in the same manner as in EXAMPLE 5, to produce the organic EL device of EXAMPLE 8. The organic EL device was confirmed to emit light of orange color, when a DC voltage of 15 V was applied to between the transparent electroconductive anode layer and cathode layer (anode: +, cathode: −).

Comparative Example 2

A glass substrate (soda lime glass, 1 mm thick) was coated with the same coating liquid for forming the transparent electroconductive anode as that used in EXAMPLE 4 by wire bar coating (wire diameter: 0.3 mm), and heat-treated at 40° C. for 15 minutes and then 120° C. for 30 minutes, to form the transparent electroconductive anode layer (film thickness: 3 μm) composed of the fine ITO particles on the flat and smooth substrate. The anode layer had the following film characteristics, visible light transmittance: 80.5%, haze: 3.1% and surface resistivity: 4200 Ω/square.

Then, the transparent electroconductive anode layer was coated with the same coating liquid for forming the light-emitting layer of polymer as that used in EXAMPLE 1 by spin coating (150 rpm, 60 seconds), after the glass substrate on which the anode layer was formed was pre-heated at 40° C., and then heat-treated at 80° C. for 60 minutes under a vacuum, to form the light-emitting layer of polymer. The light-emitting layer of polymer was coated with the 2-layered cathode layer of Ca and Ag (size: 0.5 by 0.5 cm) in the same manner as in EXAMPLE 4, to produce the organic EL device of COMPARATIVE EXAMPLE 2, which included neither flat and smooth substrate nor adhesive layer.

A total of the 10 organic EL devices of COMPARATIVE EXAMPLE 2 were prepared in the same manner as above, and a DC voltage of 15 V was applied to between the transparent electroconductive anode layer and cathode layer (anode: +, cathode: −) of each device. All of these devices failed to emit light, because of a short circuit between the anode and cathode layers.

It is found, based on the results of COMPARATIVE EXAMPLES 1 and 2, that an organic EL device of the conventional structure with a transparent electroconductive anode layer formed by a coating method, and light-emitting layer of polymer and cathode layer layered structured on the anode layer is very difficult to stably emit light, because of a short circuit evolving between the transparent electroconductive anode layer and cathode layer.

By contrast, the organic EL device of the present invention, prepared in each of EXAMPLES 1 to 8, is confirmed to stably emit light with a DC voltage, because it includes a specific transparent electroconductive layered structure, although its transparent electroconductive anode layer is prepared by a coating method.

The transparent electroconductive layered structure of the present invention allows a light-emitting layer of polymer or cathode layer with no surface irregularities or projections to be easily formed on the flat and smooth surface of its transparent electroconductive anode layer, left by a flat and smooth substrate released from the layered structure, and can be used as a constituent component for an organic EL device. The organic EL device of the present invention has a transparent electroconductive anode layer which can be formed by a coating method carried out by a simple, low-cost procedure operating at low temperature. Therefore, it has a light-emitting layer of polymer unlikely to easily deteriorate and useful as a light source (e.g., liquid-crystal device's back light) or display.

What is claimed is:

1. A transparent electroconductive layered structure comprising a flat and smooth substrate, transparent electroconductive anode layer containing fine electroconductive particles as the main component, formed on the flat and smooth substrate by a coating method, and transparent substrate joined to the transparent electroconductive anode layer via an adhesive layer, wherein the flat and smooth substrate can be released from the transparent electroconductive anode layer.

2. A transparent electroconductive layered structure comprising a flat and smooth substrate, hole-injection layer formed on the flat and smooth substrate by a coating method, transparent electroconductive anode layer containing fine electroconductive particles as the main component, formed on the hole-injection layer by a coating method, and transparent substrate joined to the transparent electroconductive anode layer via an adhesive layer, wherein the flat and smooth substrate can be released from the hole-injection layer.

3. The transparent electroconductive layered structure according to claim 1 or 2, wherein the transparent electroconductive anode layer is further coated partly with a metallic auxiliary electrode.

4. The transparent electroconductive layered structure according to claim 1 or 2, wherein a transparent coat layer is further formed by a coating method between the transparent electroconductive anode layer and adhesive layer.

5. The transparent electroconductive layered structure according to claim 1 or 2, wherein the adhesive layer contains, in addition to an organic resin, a dehydrating agent and/or deoxidant.

6. The transparent electroconductive layered structure according to claim 1 or 2, wherein the fine electroconductive particles have an average particle diameter of 1 to 100 nm, contain a noble metal and form a net-work structure in the transparent electroconductive anode layer.

7. The transparent electroconductive layered structure according to claim 6, wherein the fine noble-metal-containing particles are metallic particles containing gold and/or silver.

8. The transparent electroconductive layered structure according to claim 1 or 2, wherein the fine electroconductive particles are oxide particles.

9. The transparent electroconductive layered structure according to claim 8, wherein the fine electroconductive oxide particles comprise at least one species of material selected from the group consisting of indium oxide, tin oxide and zinc oxide.

10. The transparent electroconductive layered structure according to claim 1 or 2, wherein the adhesive layer has a sufficient thickness to cover projections of the fine electroconductive particles which constitute the surface of the transparent electroconductive anode layer.

11. A method for producing the transparent electroconductive layered structure according to claim 1, wherein a coating liquid containing fine electroconductive particles dispersed in a solvent for forming the transparent electroconductive anode layer is spread and dried on the sufficiently flat and smooth substrate, which can be released from the coating layer formed thereon, to form the transparent electroconductive anode layer, and the transparent substrate is joined to the transparent electroconductive anode layer with an adhesive agent.

12. A method for producing the transparent electroconductive layered structure according to claim 2, wherein a coating liquid containing a hole-injecting material in a solvent for forming the hole-injection layer is spread and dried on the sufficiently flat and smooth substrate, which can be released from the coating layer formed thereon, to form the hole-injection layer on the flat and smooth substrate, then a coating liquid containing fine electroconductive particles in a solvent for forming the transparent electroconductive anode layer is spread and dried on the hole-injection layer to form the transparent electroconductive anode layer, and the transparent substrate is joined to the transparent electroconductive anode layer with an adhesive agent.

13. The method according to claim 11 or 12 for producing the transparent electroconductive layered structure, wherein the transparent electroconductive anode layer formed is coated partly with a metallic auxiliary electrode, formed by printing the transparent electroconductive anode layer with a paste containing fine metallic particles in a solvent for forming the metallic auxiliary electrode and curing the paste.

14. The method according to claim 11 or 12 for producing the transparent electroconductive layered structure, wherein a coating liquid containing a binder in a solvent for forming a transparent coat layer is spread and dried on the transparent electroconductive anode layer to coat the anode layer with the transparent coat layer, and the transparent substrate is joined to the transparent coat layer with an adhesive agent.

15. The method according to claim 11 or 12 for producing the transparent electroconductive layered structure, wherein the adhesive agent contains, in addition to an organic resin, a dehydrating agent and/or deoxidant.

16. The method according to claim 11 or 12 for producing the transparent electroconductive layered structure, wherein the fine electroconductive particles have an average particle diameter of 1 to 100 nm, and contain a noble metal.

17. The method according to claim 16 for producing the transparent electroconductive layered structure, wherein the fine noble-metal-containing particles are metallic particles containing gold and/or silver.

18. The method according to claim 11 or 12 for producing the transparent electroconductive layered structure, wherein the fine electroconductive particles are fine electroconductive oxide particles.

19. The method according to claim 18 for producing the transparent electroconductive layered structure, wherein the fine electroconductive oxide particles comprise at least one species of material selected from the group consisting of indium oxide, tin oxide and zinc oxide.

20. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 1 or 2, and the cathode layer is formed on the light-emitting layer of polymer.

21. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 3, and the cathode layer is formed on the light-emitting layer of polymer.

22. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 4, and the cathode layer is formed on the light-emitting layer of polymer.

23. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 5, and the cathode layer is formed on the light-emitting layer of polymer.

24. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 6, and the cathode layer is formed on the light-emitting layer of polymer.

25. An organic EL device provided with a light-emitting layer of polymer and cathode layer, wherein the light-emitting layer is formed by a coating method on the surface of the transparent electroconductive anode layer or hole-injection layer left by the flat and smooth substrate released from the transparent electroconductive layered structure according to claim 8, and the cathode layer is formed on the light-emitting layer of polymer.

26. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 11 or 12 to form the light-emitting layer of polymer on the surface, and a cathode layer is formed on the light-emitting layer of polymer.

27. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 13 to form the light-emitting layer of polymer on the surface, and a cathode layer is formed on the light-emitting layer of polymer.

28. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 14 to form the light-emitting layer of polymer on the surface, and a cathode layer is formed on the light-emitting layer of polymer.

29. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 15 to form the light-emitting layer of polymer on the surface, and a cathode layer is formed on the light-emitting layer of polymer.

30. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 16 to form the light-emitting layer of polymer on the surface, and a cathode layer is formed on the light-emitting layer of polymer.

31. A method for producing the organic EL device, wherein a coating liquid, containing a high-molecular-weight light-emitting material or precursor therefor in a solvent, for forming a light-emitting layer of polymer is spread and dried on the surface of the transparent electroconductive anode layer or hole-injection layer left by the flat and smooth substrate released from the transparent electroconductive layered structure produced by the method according to claim 18 to form the light-emitting layer of polymer on the surface, and a cathode layer is formed on the light-emitting layer of polymer.

* * * * *